(12) United States Patent
CletusWittman

(10) Patent No.: US 7,380,668 B2
(45) Date of Patent: Jun. 3, 2008

(54) RETICLE CARRIER

(75) Inventor: Boyd CletusWittman, Shorewood, MN (US)

(73) Assignee: Fab Integrated Technology, Inc., Colorado Springs, CO (US)

( * ) Notice: Subject to any disclaimer, the term of this patent is extended or adjusted under 35 U.S.C. 154(b) by 459 days.

(21) Appl. No.: 10/960,682

(22) Filed: Oct. 7, 2004

(65) Prior Publication Data

US 2006/0076264 A1 Apr. 13, 2006

(51) Int. Cl.
*B65D 85/90* (2006.01)

(52) U.S. Cl. .................. 206/710; 206/454; 16/425

(58) Field of Classification Search ............. 206/710, 206/454, 455; 414/217.1; 16/425
See application file for complete search history.

(56) References Cited

U.S. PATENT DOCUMENTS

| | | | |
|---|---|---|---|
| 4,532,970 A | 8/1985 | Tullis et al. | |
| 4,534,389 A | 8/1985 | Tullis | |
| 4,739,882 A | 4/1988 | Parikh et al. | |
| 4,830,182 A * | 5/1989 | Nakazato et al. | 206/454 |
| 4,995,430 A * | 2/1991 | Bonora et al. | 141/98 |
| 5,330,053 A | 7/1994 | Tabuchi et al. | |
| 5,577,610 A | 11/1996 | Okuda et al. | |
| 5,611,452 A * | 3/1997 | Bonora et al. | 220/378 |
| 5,740,845 A | 4/1998 | Bonora et al. | |
| 6,216,873 B1 | 4/2001 | Fosnight et al. | |
| 6,319,297 B1 | 11/2001 | Fosnight | |
| 6,338,409 B1 | 1/2002 | Neary | |
| 6,513,654 B2 | 2/2003 | Smith et al. | |
| 6,536,813 B2 | 3/2003 | Smith et al. | |
| 6,755,602 B2 | 6/2004 | Tseng et al. | |
| 2002/0066692 A1 | 6/2002 | Smith | |
| 2004/0005209 A1 | 1/2004 | Su et al. | |
| 2004/0206664 A1* | 10/2004 | Nyseth et al. | 206/710 |
| 2005/0109668 A1* | 5/2005 | Burns et al. | 206/711 |

* cited by examiner

*Primary Examiner*—Mickey Yu
*Assistant Examiner*—Jerrold Johnson
(74) *Attorney, Agent, or Firm*—Dale B. Halling

(57) ABSTRACT

A reticle carrier has a cover. A gasket is attached to the cover. A door mates with the cover.

6 Claims, 17 Drawing Sheets

RETICLE CARRIER

RELATED APPLICATIONS

None.

FIELD OF THE INVENTION

The present invention relates generally to the field of semiconductor tools and more particularly to a reticle carrier.

BACKGROUND OF THE INVENTION

Semiconductor processing is a photographic chemical etching process that requires that the semiconductor wafer be selectively exposed to light. In a photograph, light is shined through a negative to selectively expose photographic paper. In semiconductor manufacturing, light is shined through a reticle onto the semiconductor wafer as part of the photographic chemical etching process. Any particles on the reticle or imperfections in the reticle result in defects in the semiconductor circuitry. As a result, reticle carriers are used to protect reticles from particles and damage. Present reticle carriers are not user friendly and do not perform there function well.

Thus there exists a need for an improved reticle carrier that overcomes these and other problems.

SUMMARY OF INVENTION

A reticle carrier that overcomes these and other problems has a cover. A gasket is attached to the cover. A door mates with the cover. The gasket may be conductive. The cover may be made of a conductive material. A robot handle may be attached to the cover. The robot handle may have a handhold. The robot handle may have a flat surface allowing carriers to be stacked. The door may have two or more gas purge ports.

In one embodiment, a carrier for a reticle has a cover with a latch port. A latch has a tongue. The latch mates with the latch port. A door has a flange that mates with the tongue of the latch. The latch is not biased in an open or a closed position. A locking lip engages a ridge of the latch. A gasket attaches to the cover. A reticle holder may be attached to the cover. The reticle holder has a number of engaging flanges that engage a reticle near a corner. The reticle holder snap fits to the cover. The door has a number of reticle alignment guides.

In one embodiment, a reticle carrier has a cover made of an antistatic material. A door is made of a conductive material. A gasket is attached to the cover and mates with the door. The cover may be made of a clear material. A reticle holder may be attached to the cover and be made of a conductive material. The gasket may be made of a conductive material. A latch may be attached to the cover. The latch may be made of a conductive material. A robot handle may snap fits on to the cover.

DETAILED DESCRIPTION OF THE DRAWINGS

A reticle carrier that is stackable, with or without the robot handles, has the gasket in the cover so that particles do not collect in the gasket. The robot handles have holes so that a human can easily pickup the reticle carrier even when the robot handle is attached.

Figure 1:
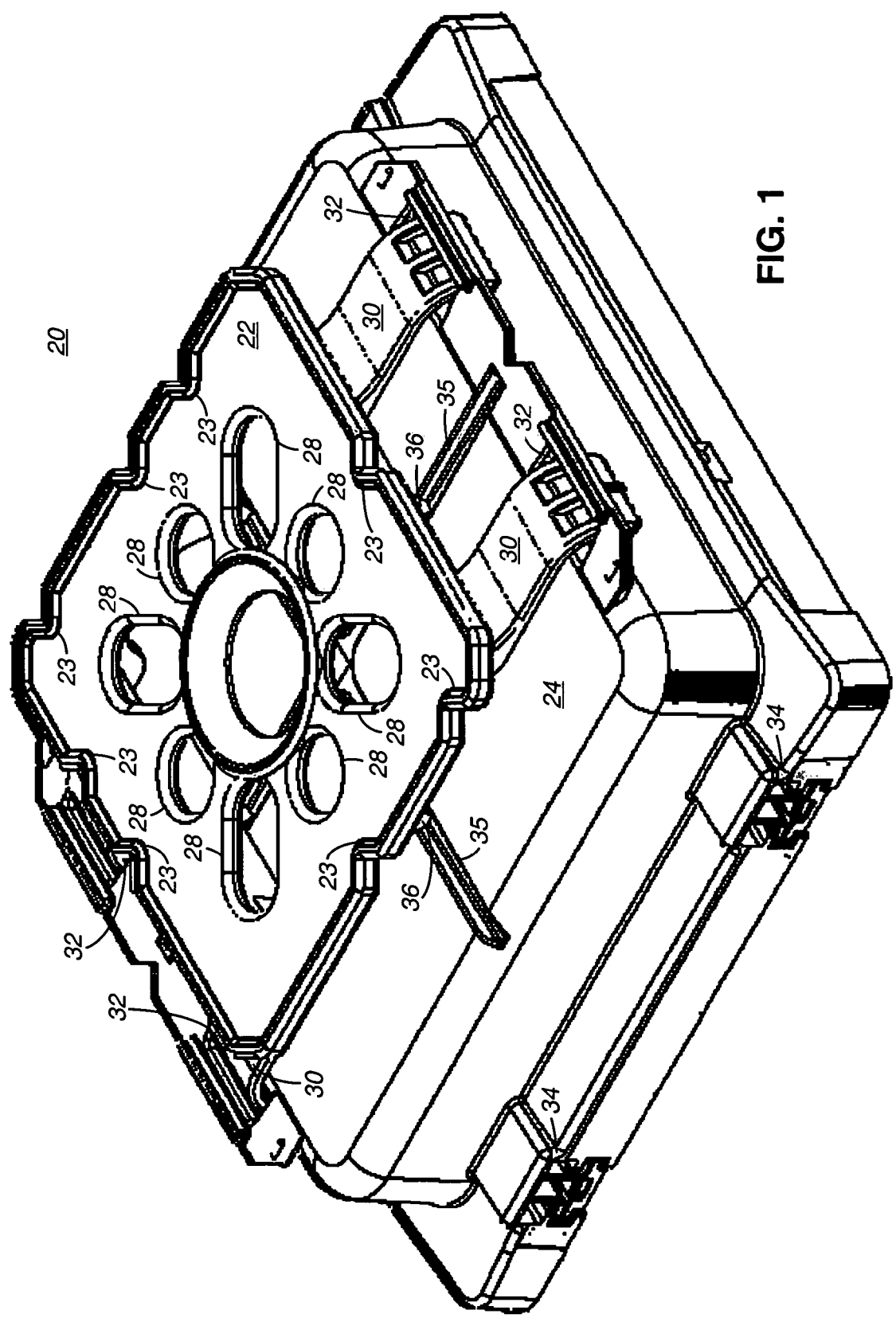
FIG. 1 is a top right perspective view of a reticle carrier in accordance with one embodiment of the invention.

FIG. 1 is a top right perspective view of a reticle carrier 20 in accordance with one embodiment of the invention. The reticle carrier 20 has a robot handle 22 attached to a cover 24. The robot handle 22 has a number of robot alignment notches 23. In the semiconductor industry the location of these notches is defined by a standard. A center opening 26 in the robot handle 22 is also used for alignment by a robot. A plurality of finger holes 28 surround the center opening 26. The robot handle 22 has four arms 30, three of which can be seen, with tips that are curved and engage openings 32 of on a top surface of the cover 24. In one embodiment, the tips snap fit into the openings 32. The cover 24 also has a number of latch ports 34 where a latch holds a door to the cover 24. The top of the cover 24 also has a pair of grooves 35 that are used to align the robot handle 22 on the cover 24. Note that the robot handle 22 has alignment pins 36 that engage the grooves 34. The grooves 35 and alignment pins 36 are offset from the robot handle 22, due to the asymmetry of the arms 30, and only allow the handle 22 to fit on the cover 24 in one orientation. This reduces operator errors due to misaligned robot handles with respect to the covers.

Figure 2:
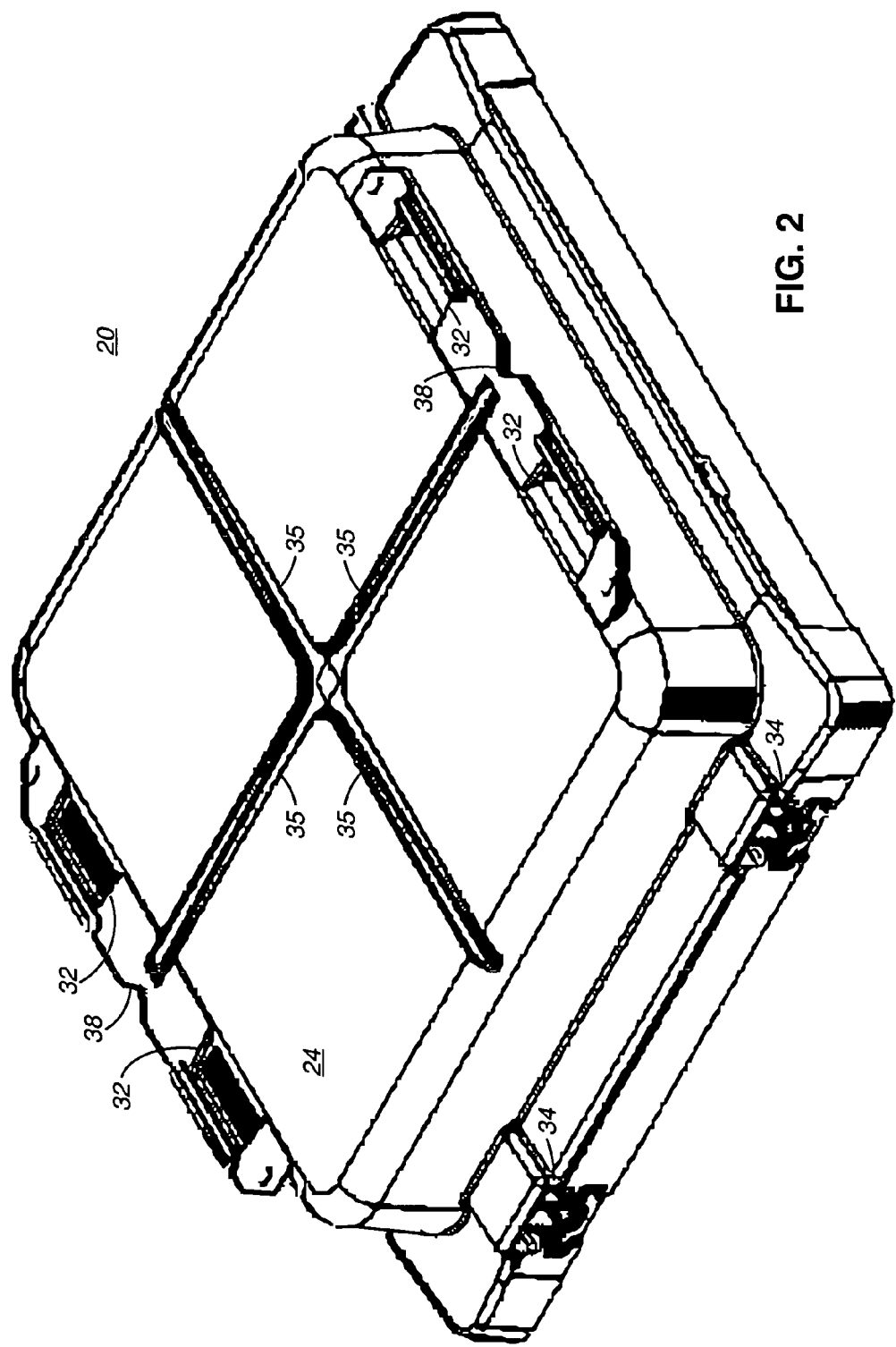
FIG. 2 is a top right perspective view of a reticle carrier in accordance with one embodiment of the invention.

FIG. 2 is a top right perspective view of a reticle carrier 20 in accordance with one embodiment of the invention. This view shows the reticle carrier 20 without the robot handle 22. Note that the cover 24 also has alignment notches 38.

Figure 3:
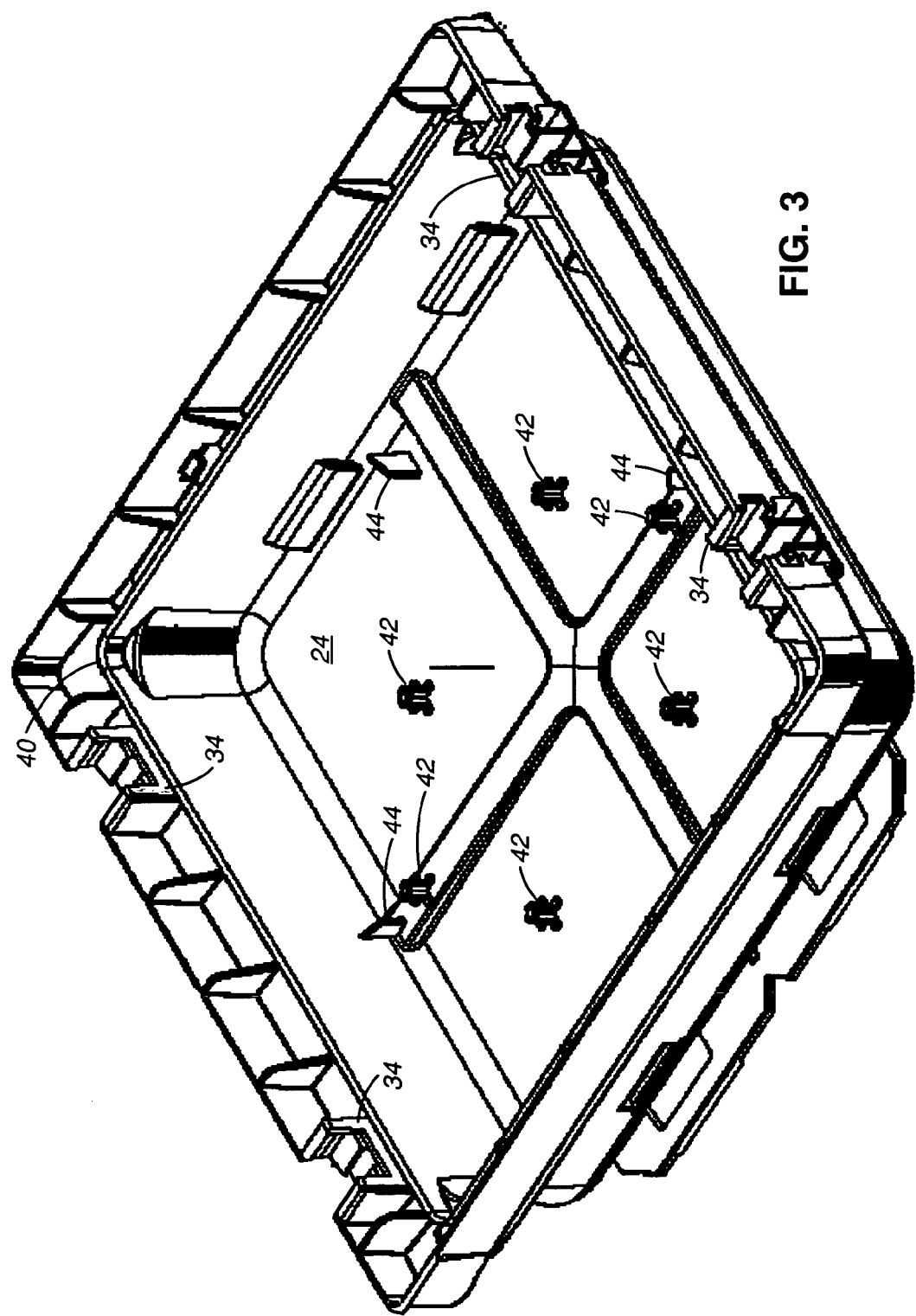
FIG. 3 is a top right perspective view of the underside of a cover of a reticle carrier in accordance with one embodiment of the invention.

FIG. 3 is a top right perspective view of the underside of a cover 24 of a reticle carrier in accordance with one embodiment of the invention. The underside of the cover 24 shows the latch ports 34. In this embodiment, the cover 24 has four latch ports 34. The underside of the cover 24 also has a ridge 40 along a periphery that holds a gasket (not shown). In addition, the underside of the cover 24 has six engaging pegs 42. The underside of the cover 24 also has a number of hold down fins 44. These fins 44 ensure that a reticle in the carrier can only move so far within the carrier.

Figure 4:
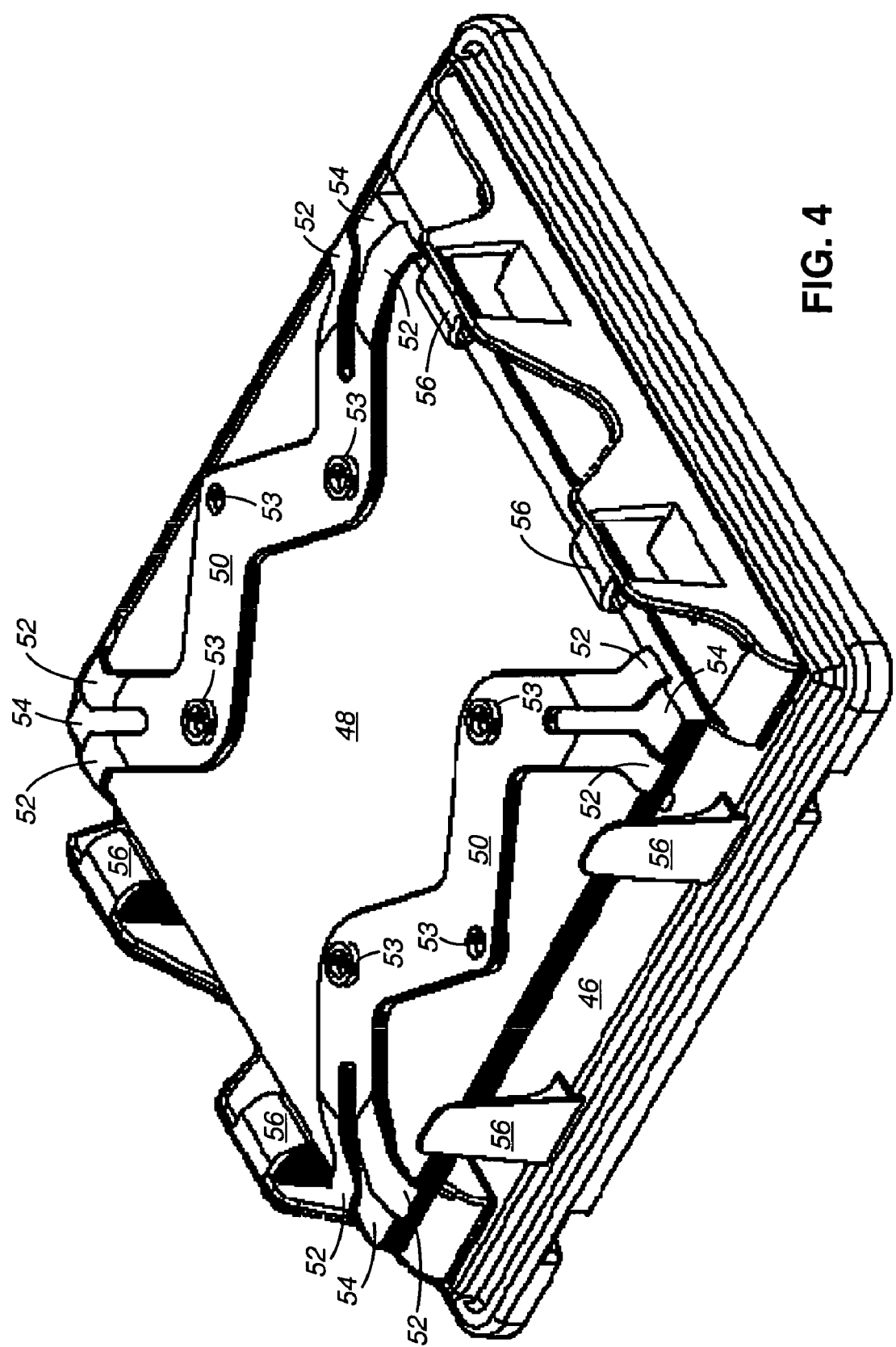
FIG. 4 is a top right perspective view of a door of a reticle carrier in accordance with one embodiment of the invention.

FIG. 4 is a top right perspective view of a door 46 of a reticle carrier in accordance with one embodiment of the invention. The reticle door 46 is shown with a reticle 48 and a pair of reticle holders 50. The reticle holders 50 have six engaging holes 52 that snap fit into the engaging pegs 42 (see FIG. 3) of the underside of the cover 24. The holders 50 have engaging flanges 52 that hold the reticle 48 near a corner 54 of the reticle 48. The door 46 has a number of reticle alignment flanges 56. These flanges 56 are flexible and hold the reticle 48 in place. The door 46 also has a pair of alignment slats 56 that align the door 46 to the cover 24.

Figure 5:
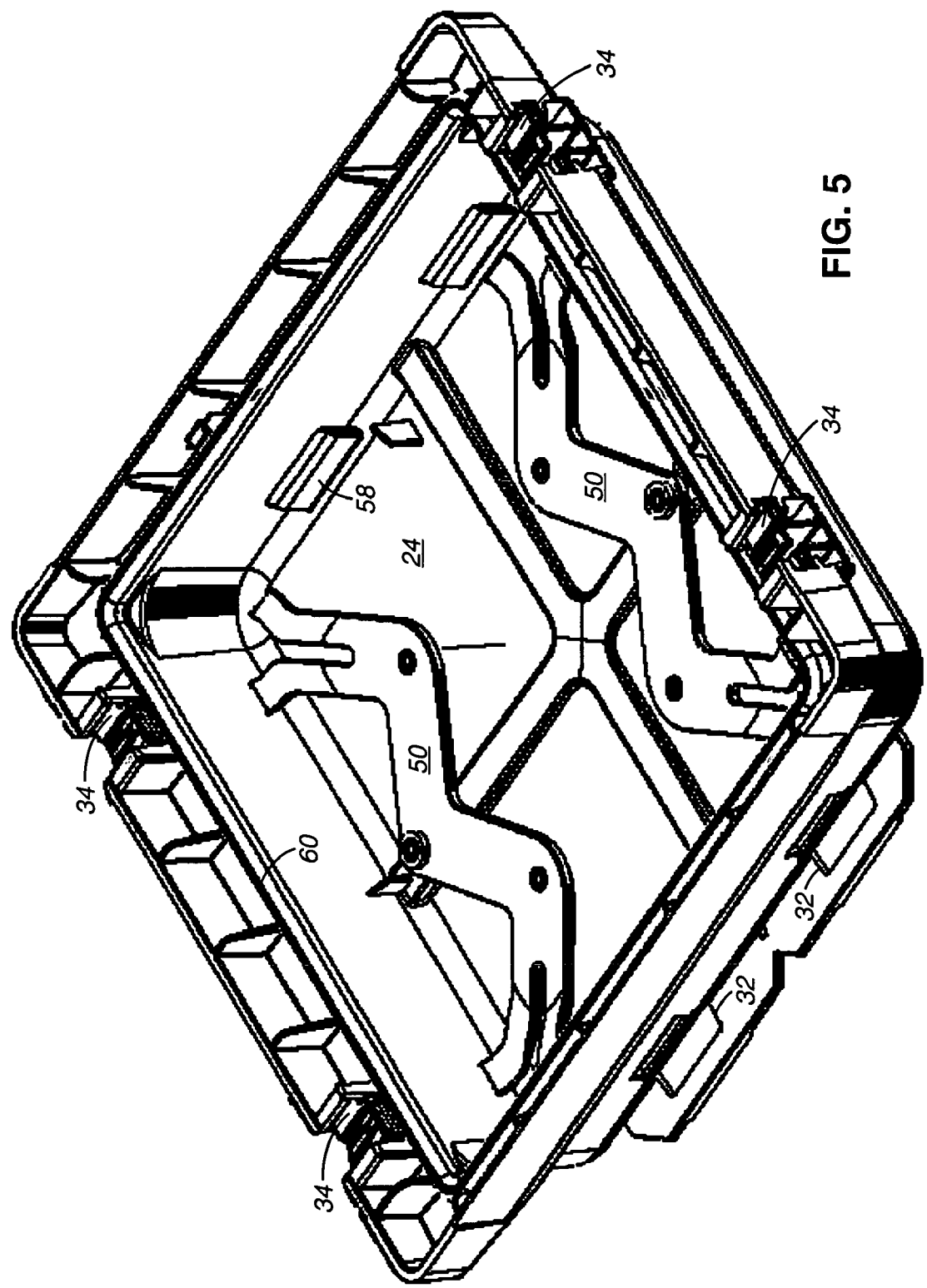
FIG. 5 is a top right perspective view of the underside of a cover of a reticle carrier in accordance with one embodiment of the invention.

FIG. 5 is a top right perspective view of the underside of a cover 24 of a reticle carrier in accordance with one embodiment of the invention. The reticle holders 50 are shown attached to the engaging pegs. This figure also shows the back side of the indentation 58 that engage the tips of the robot arms 30. A gasket 60 is also shown along the lip 40 of the cover 24.

Figure 6:
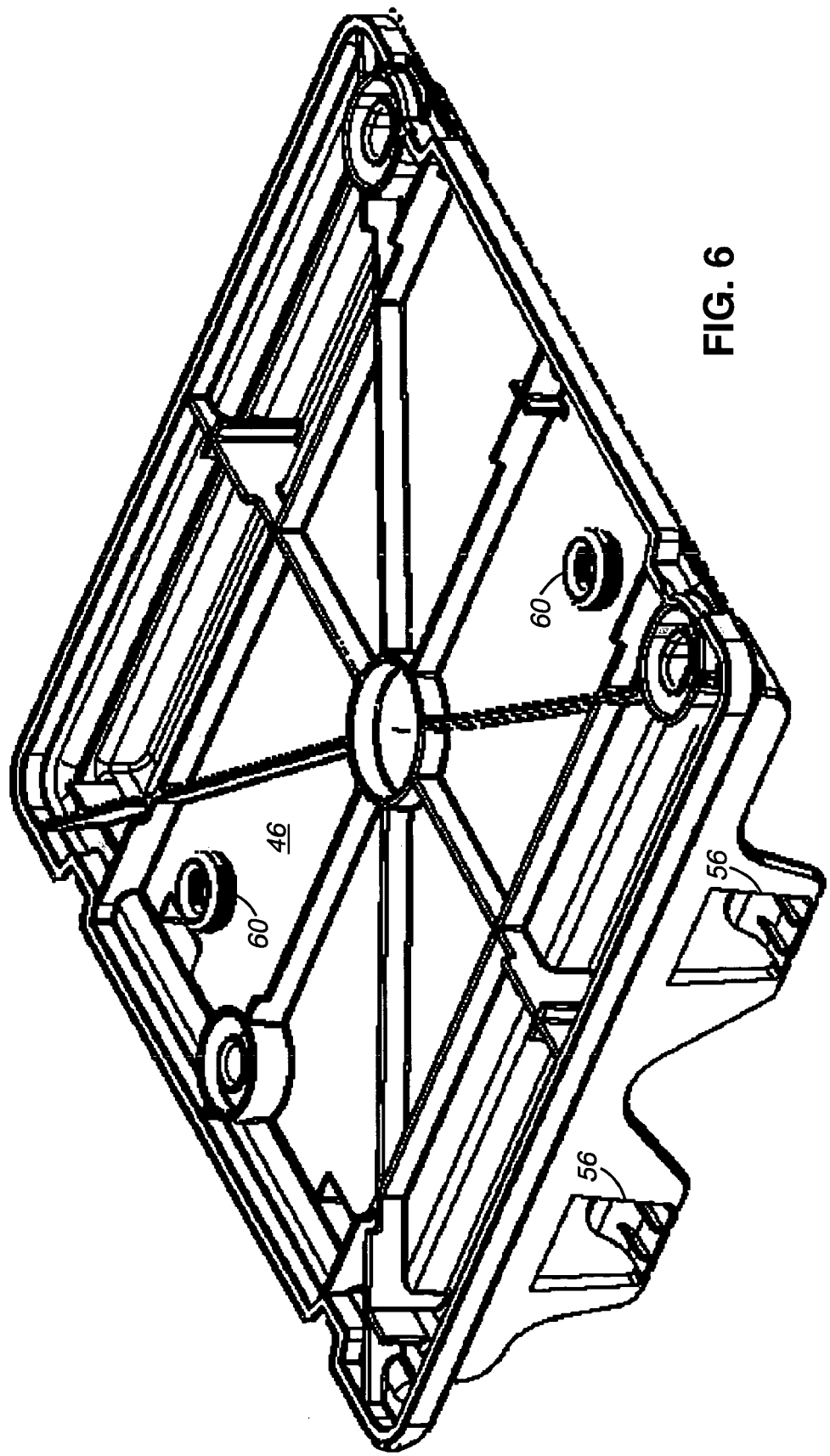
FIG. 6 is a top right perspective view of the underside of a door of a reticle carrier in accordance with one embodiment of the invention.

FIG. 6 is a top right perspective view of the underside of a door 46 of a reticle carrier in accordance with one embodiment of the invention. The door 46 has a pair of gas purge ports 60.

Figure 7:
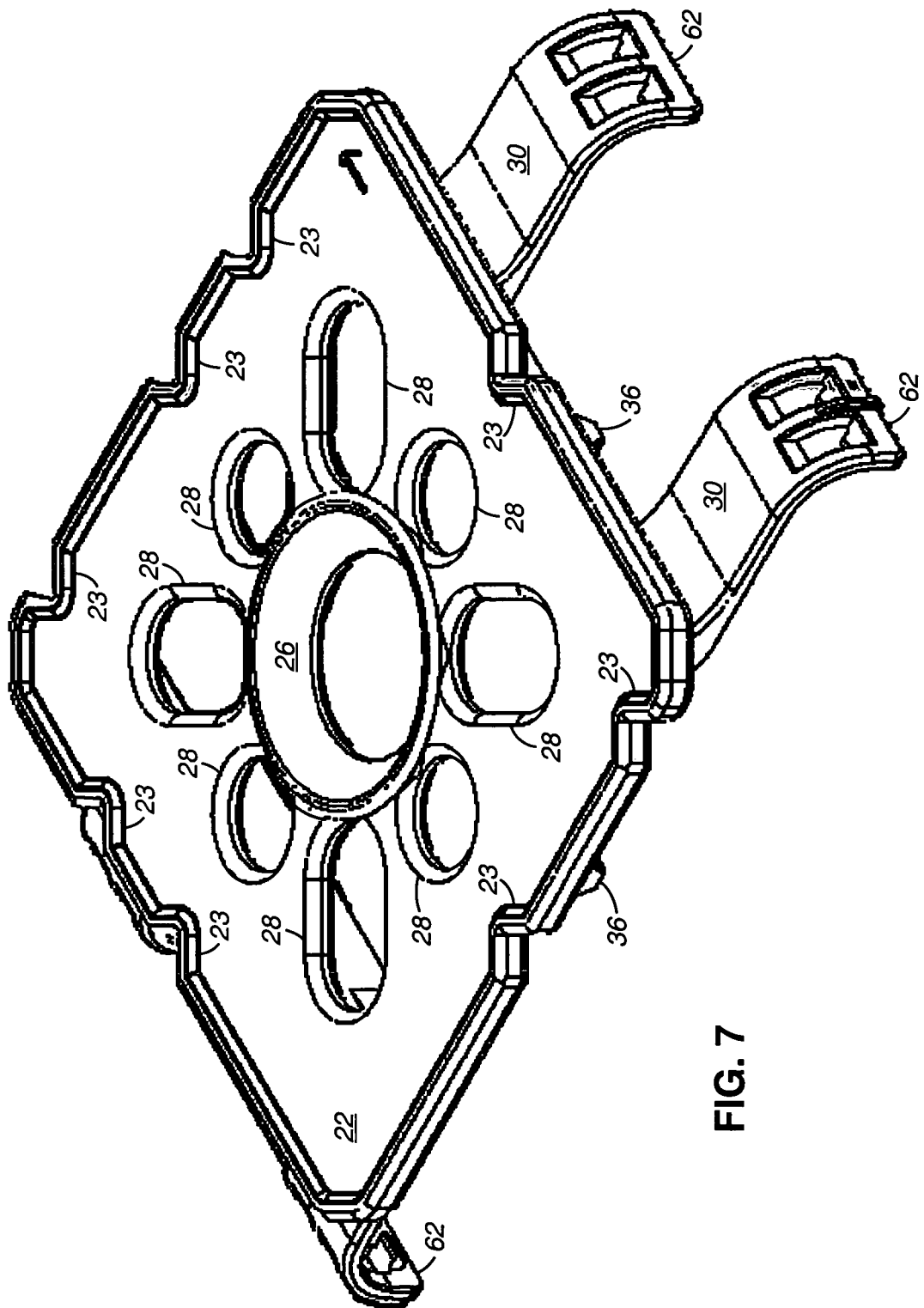
FIG. 7 is a top right perspective view of a robot handle in accordance with one embodiment of the invention.

FIG. 7 is a top right perspective view of a robot handle 22 in accordance with one embodiment of the invention. This figure shows the tips 62 of the arms 30. The tips 62 have fingers that engage the indentations 58 in the cover 24 forming a snap fit.

Figure 8:
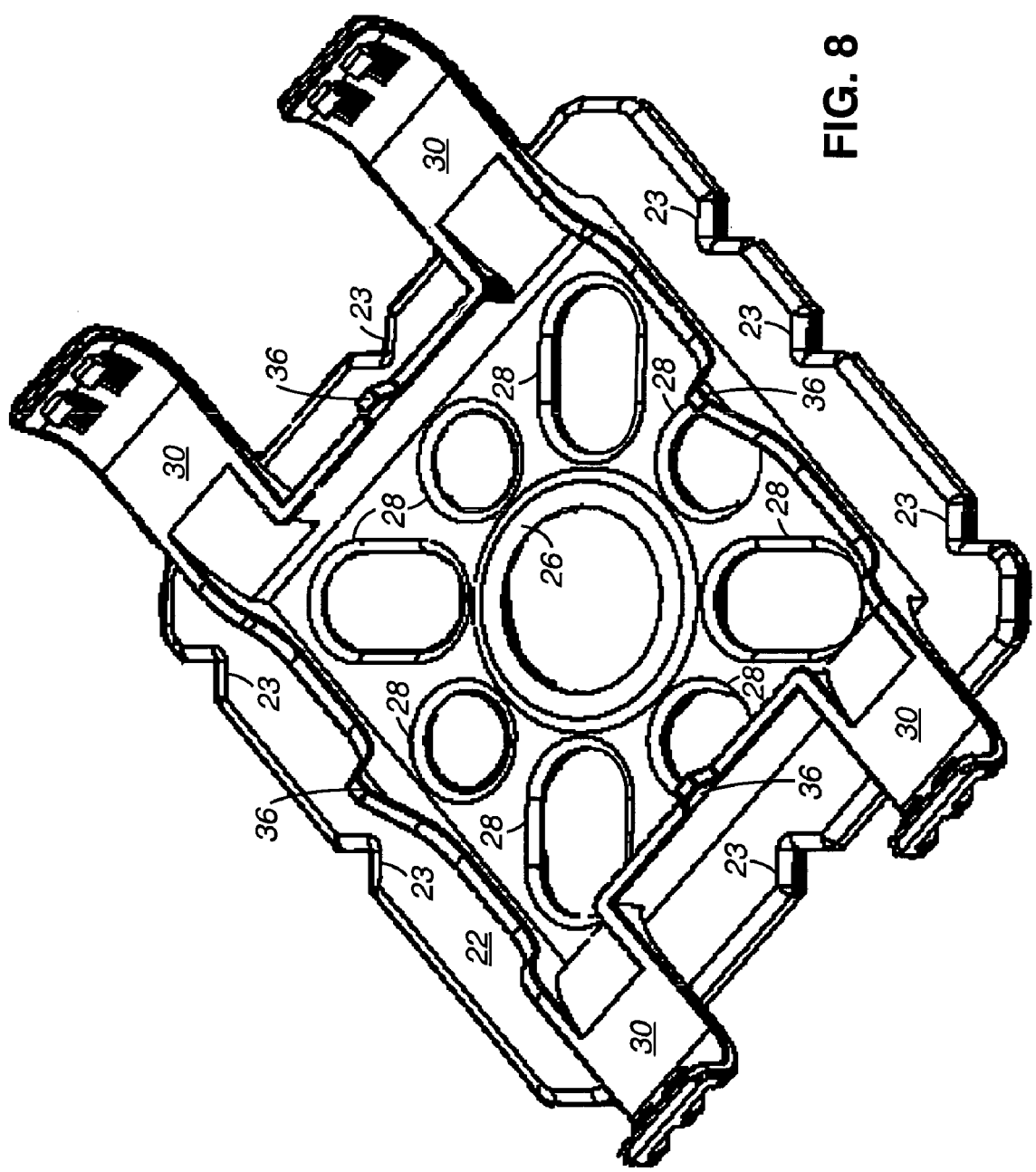
FIG. 8 is a top right perspective view of the underside a robot handle in accordance with one embodiment of the invention.

FIG. 8 is a top right perspective view of the underside a robot handle 22 in accordance with one embodiment of the invention. This view shows the alignment pins 36 more clearly.

Figure 9:
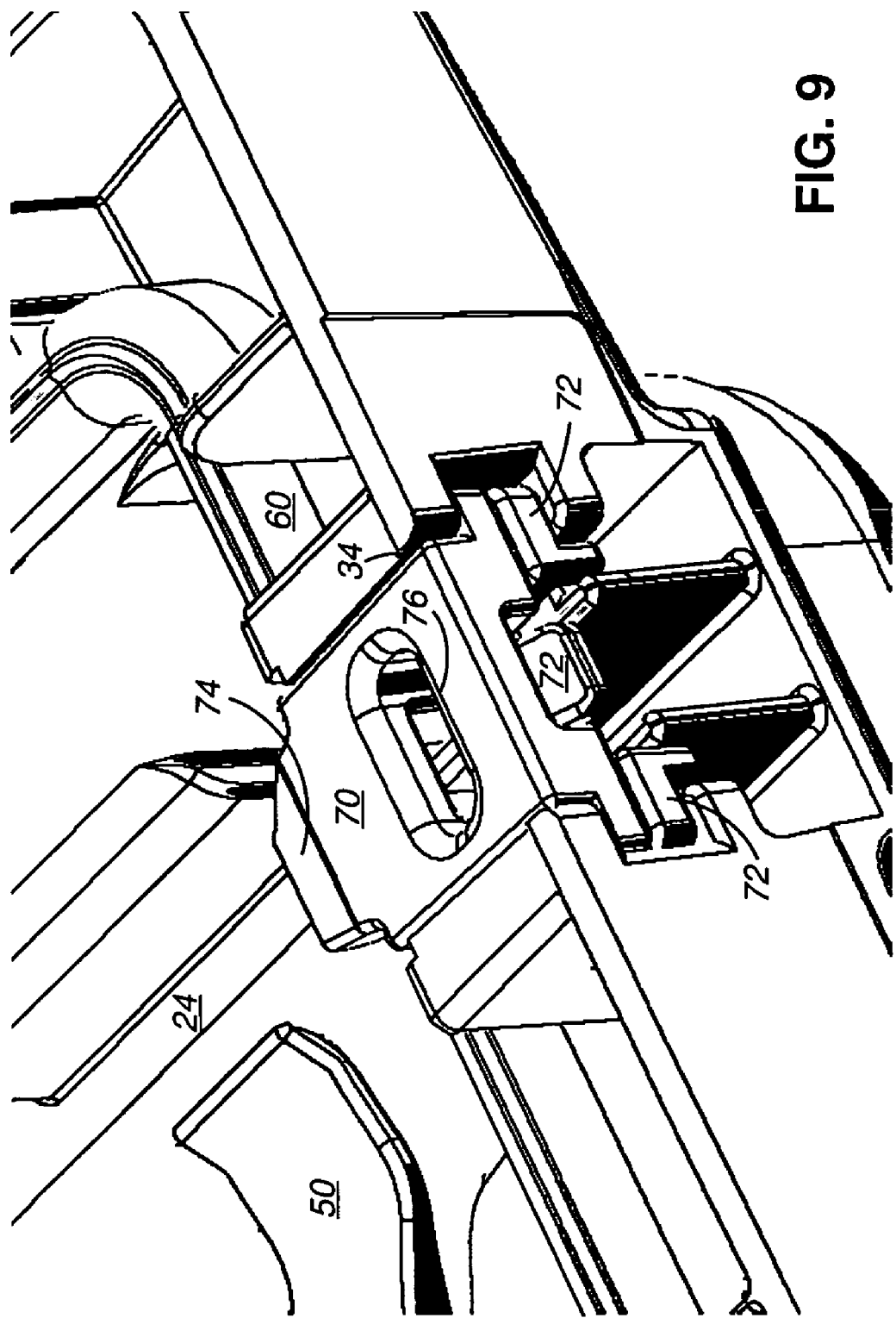
FIG. 9 is a partial perspective view of a latch of a reticle carrier in accordance with one embodiment of the invention.

FIG. 9 is a partial perspective view of a latch 70 of a reticle carrier in accordance with one embodiment of the invention. The latch 70 fits inside a latch port 34 of the cover 24. The latch 70 has a latch lock 72. The latch 70 has a tongue 74 that engages the door 46. An opening 76 in the latch 70 is used by a robot to slide the latch 74 between a closed position (shown) and an open position.

Figure 10:
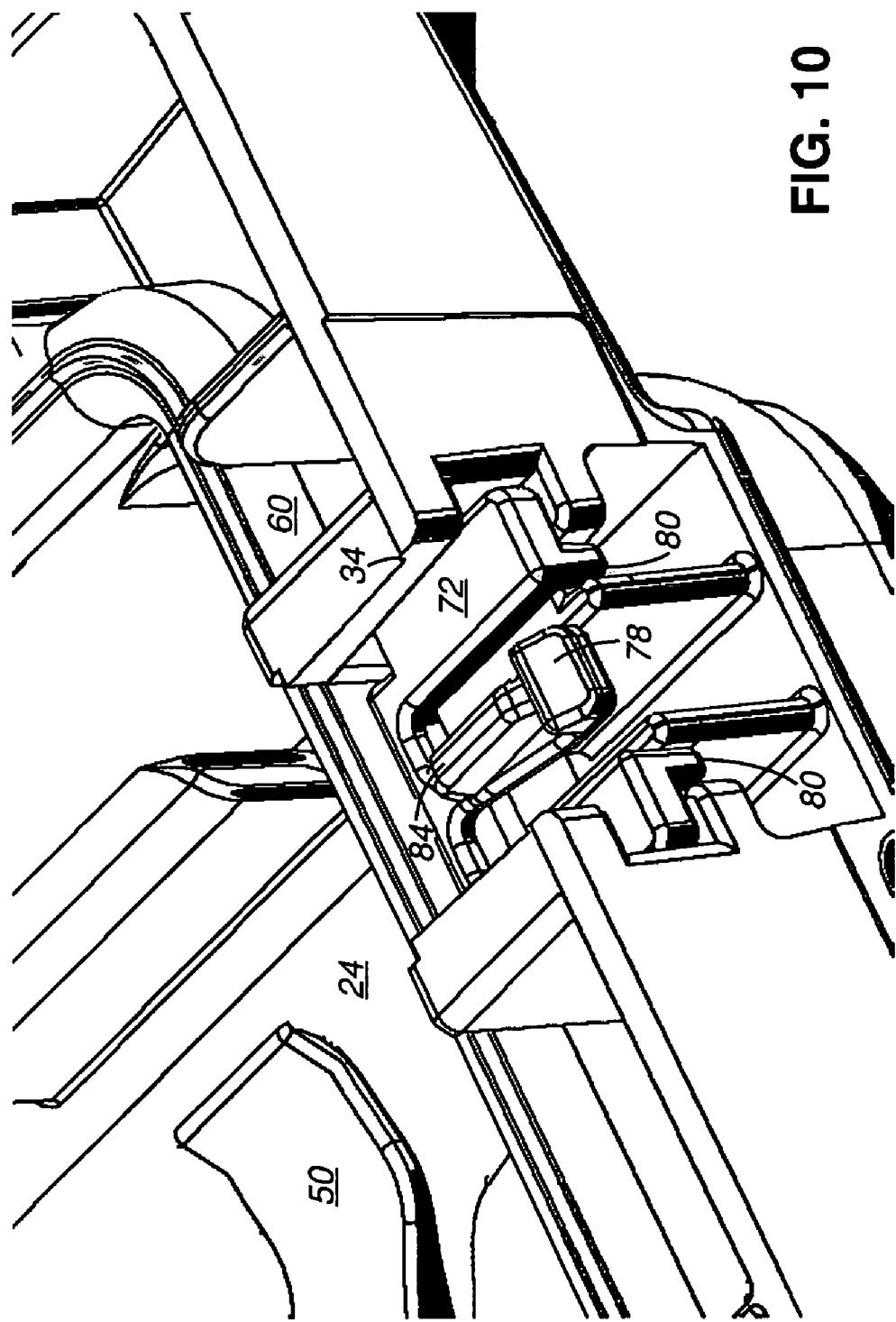
FIG. 10 is a partial perspective view of part of a latch of a reticle carrier in accordance with one embodiment of the invention.

FIG. 10 is a partial perspective view of part of a latch of a reticle carrier in accordance with one embodiment of the invention. The latch lock 72 is shown in this figure without the latch 70. The latch lock 72 has a locking lip 78 that engages a ridge of the latch 70. The latch lock 72 has four pins 80 that snap fit the latch lock 72 into the latch port 34.

Figure 11:
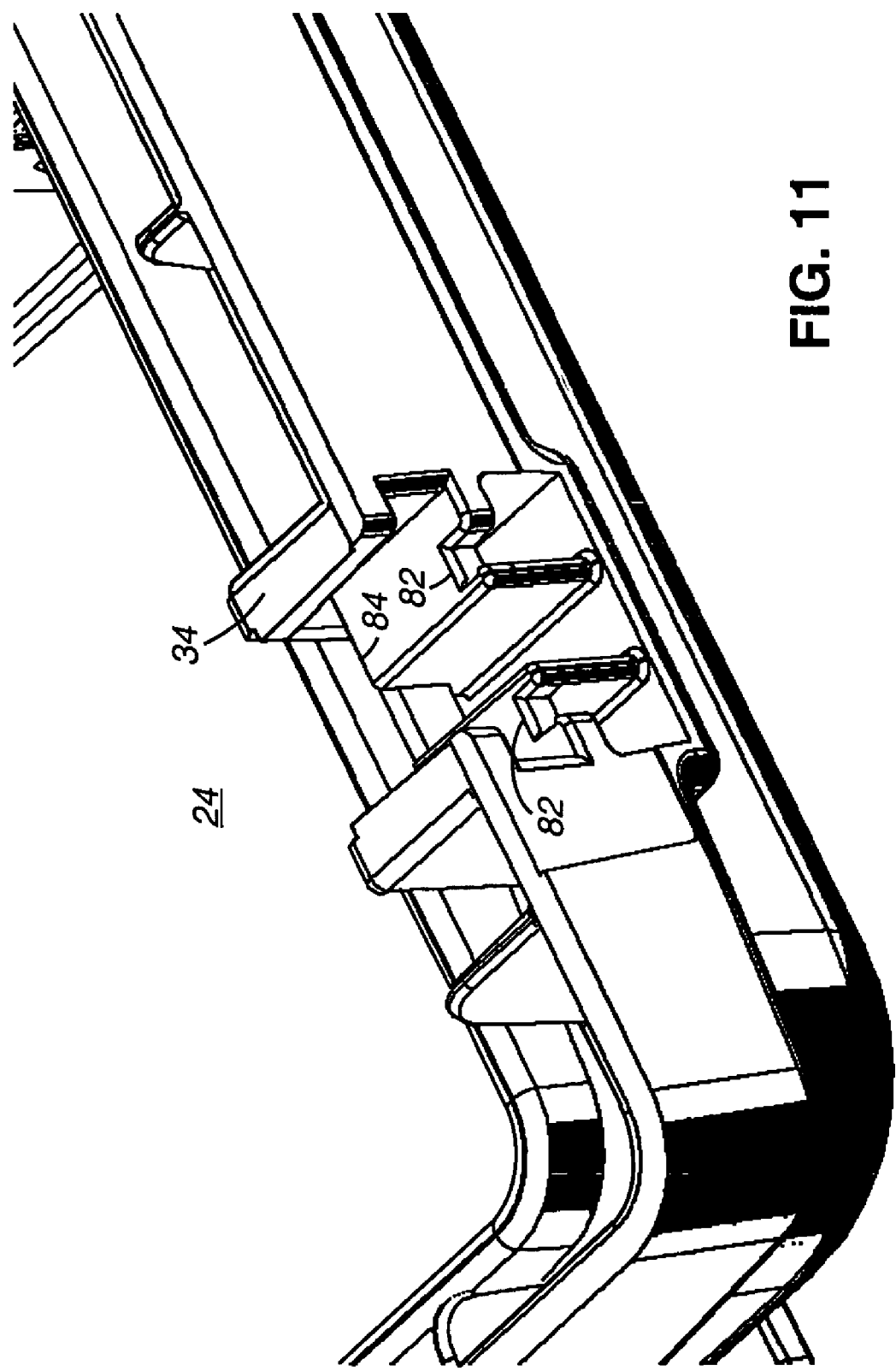
FIG. 11 is a partial perspective view of a latch port of a reticle carrier in accordance with one embodiment of the invention.

FIG. 11 is a partial perspective view of a latch port 34 of a reticle carrier in accordance with one embodiment of the invention. This figure shows the latch port 34 without the latch 70 or latch lock 72. The pins 80 of the latch lock 72 fit into slots 82 and along the ridge 84.

Figure 12:
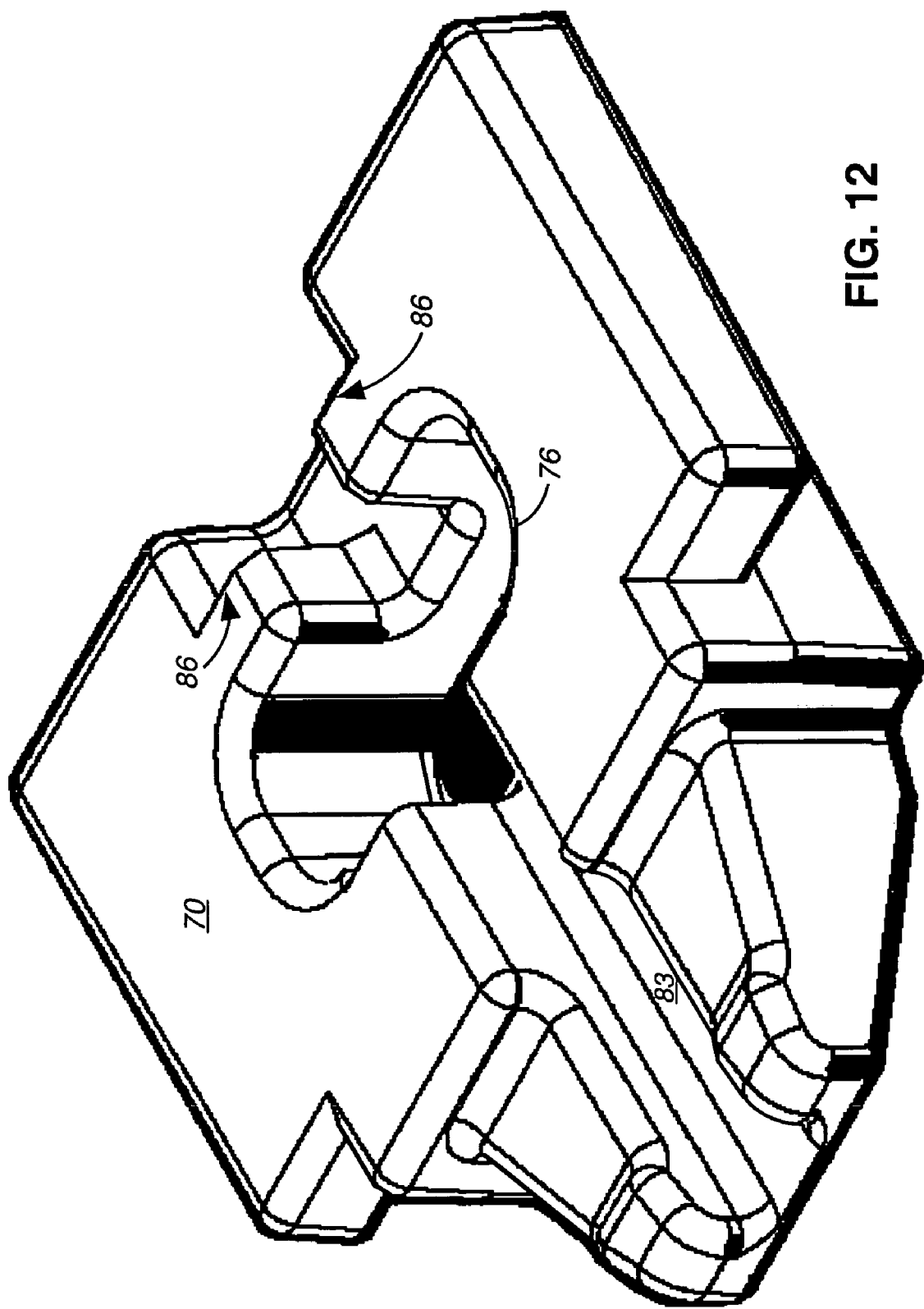
FIG. 12 is a perspective view of the underside of a part of a latch mechanism of a reticle carrier in accordance with one embodiment of the invention.

FIG. 12 is a perspective view of a part of a latch mechanism of a reticle carrier in accordance with one embodiment of the invention. The under side of the latch 70 is shown. The latch 70 has a groove 82 that mates with a ridge 84 of the latch lock 72 (See FIG. 10). The ridge 86 of the latch 70 abuts the locking lip 78 of the latch lock 72 to hold the door 46 onto the cover 24. The ridge 84 has to be depressed by the robot to slide the latch 70 to an open position. Note that the latch 70 does not use a spring to bias the latch 70 into an open or closed position.

Figure 13:
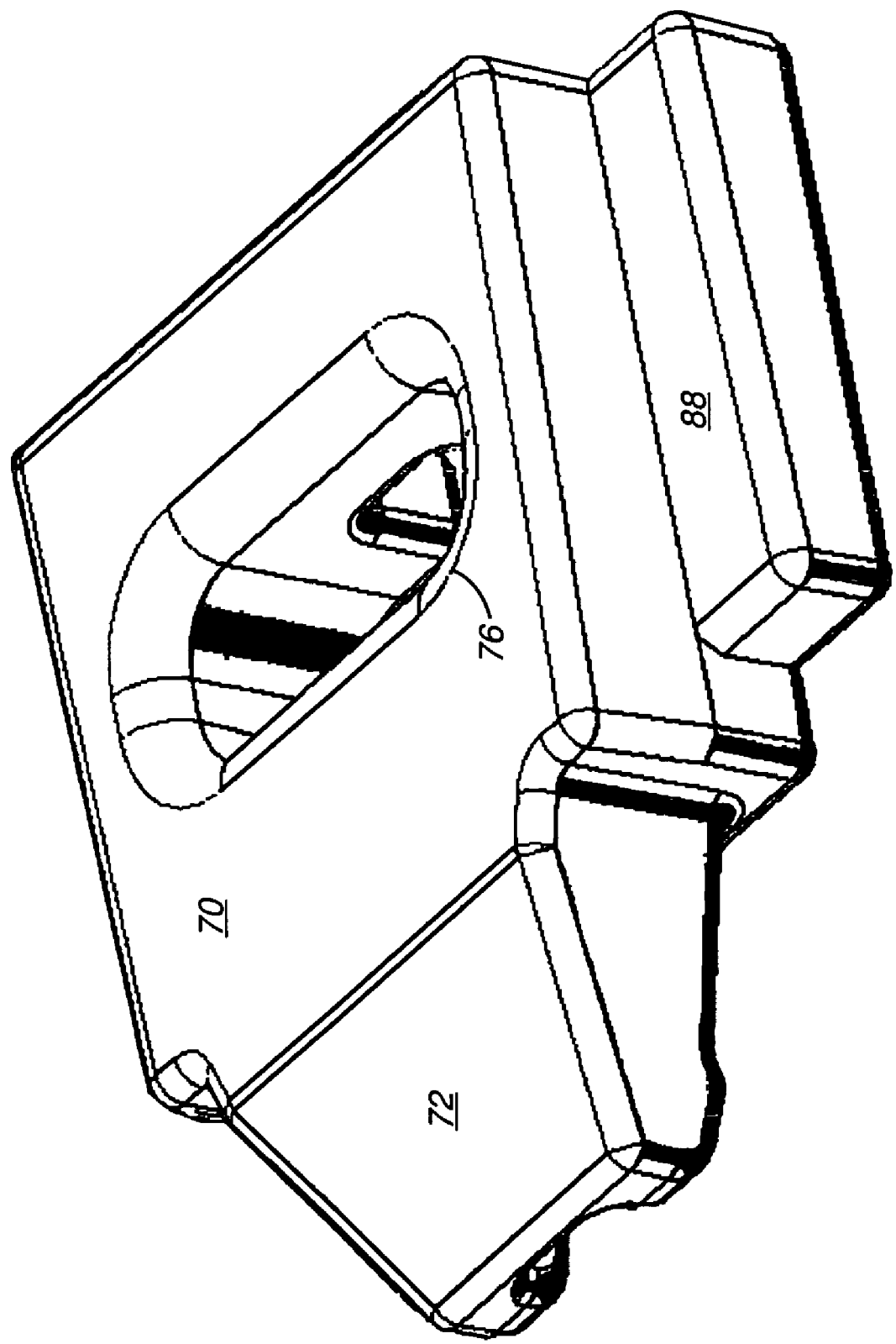
FIG. 13 is a perspective view of a part of a latch mechanism of a reticle carrier in accordance with one embodiment of the invention.

FIG. 13 is a perspective view of a part of a latch mechanism of a reticle carrier in accordance with one embodiment of the invention. This figure shows the top side of the latch 70. Note the slide 88 on the side of the latch 70. The slides 88 (one on each side) fit inside the opening of the latch port 34.

Figure 14:
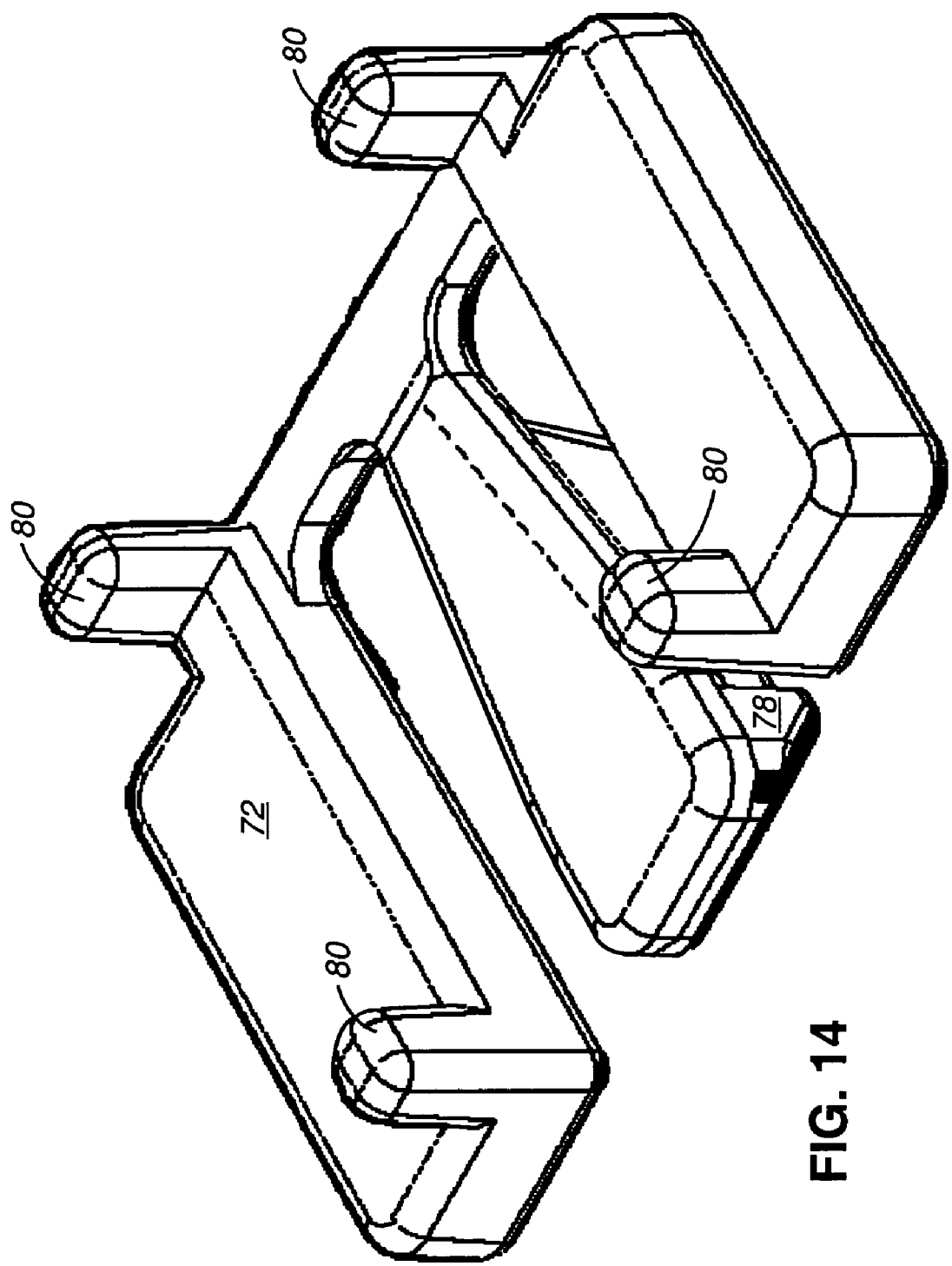
FIG. 14 is a perspective view of the underside of a latch lock of a reticle carrier in accordance with one embodiment of the invention.

FIG. 14 is a perspective view of the underside of a latch lock of a reticle carrier in accordance with one embodiment of the invention. This figure more clearly shown the pins 80 that are used to hold the latch lock 72 into the latch port 34.

Figure 15:
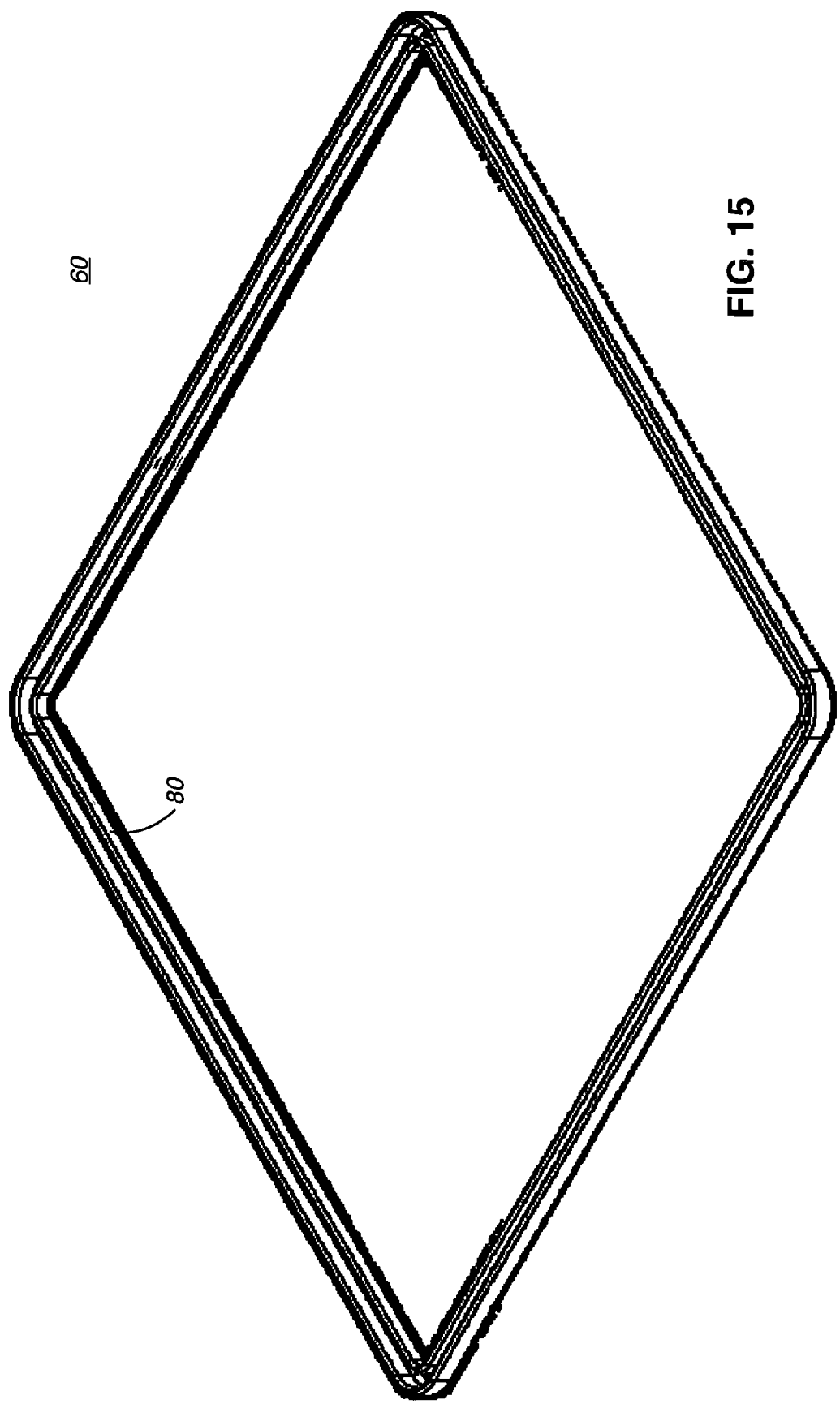
FIG. 15 is a perspective view of a gasket for a reticle carrier in accordance with one embodiment of the invention.
Figure 16:
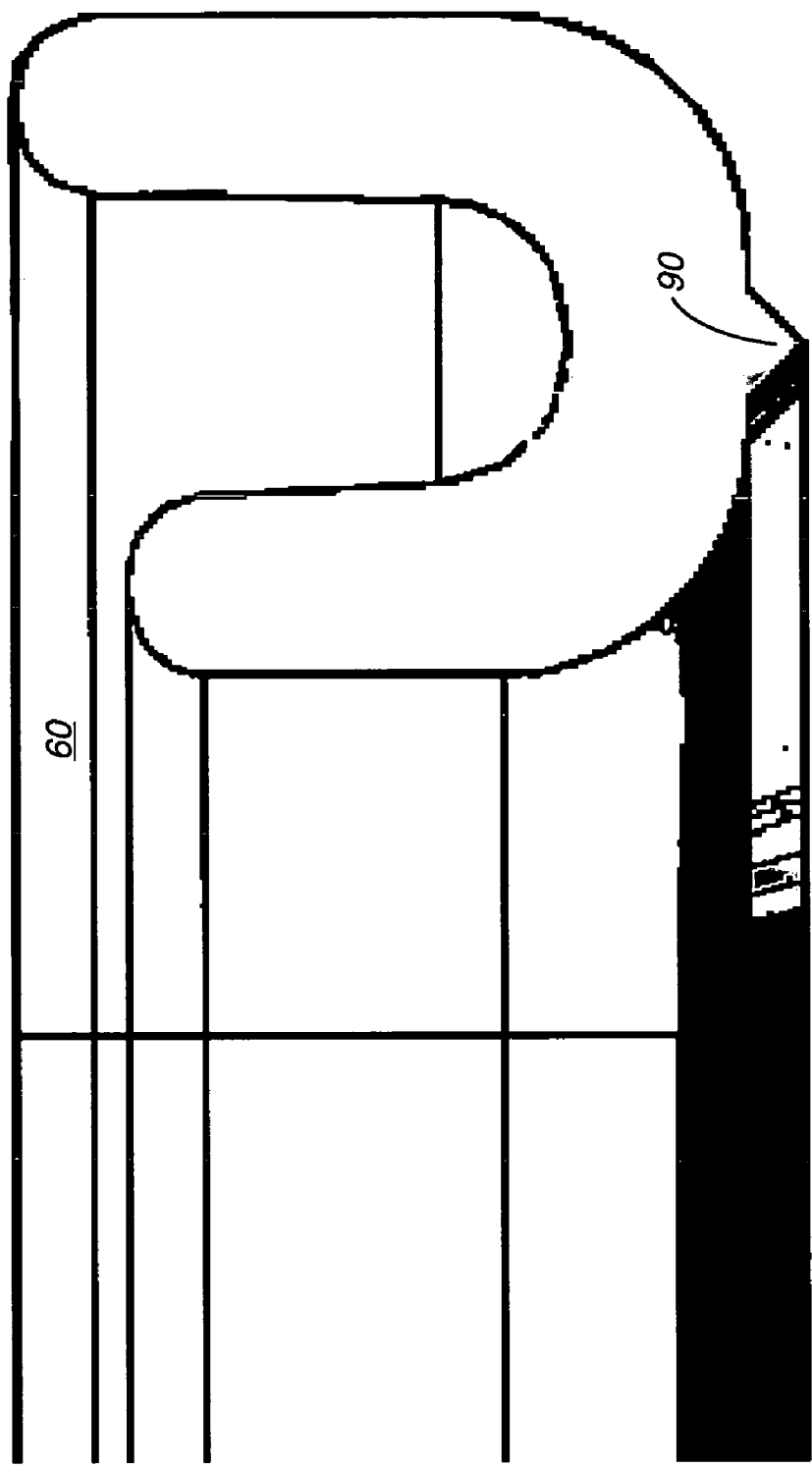
FIG. 16 is cutaway view of a gasket for a reticle carrier in accordance with one embodiment of the invention.

FIG. 15 is a perspective view of a gasket 60 for a reticle carrier in accordance with one embodiment of the invention. The gasket 60 has a "U" shaped cross section (See FIG. 16) and may have a "V" shaped tip on the bottom of the "U". The open portion of the "U" fits on the lip 40 of the cover 24. The "V" shaped tip abuts the door 46 to form an air tight seal.

Figure 17:
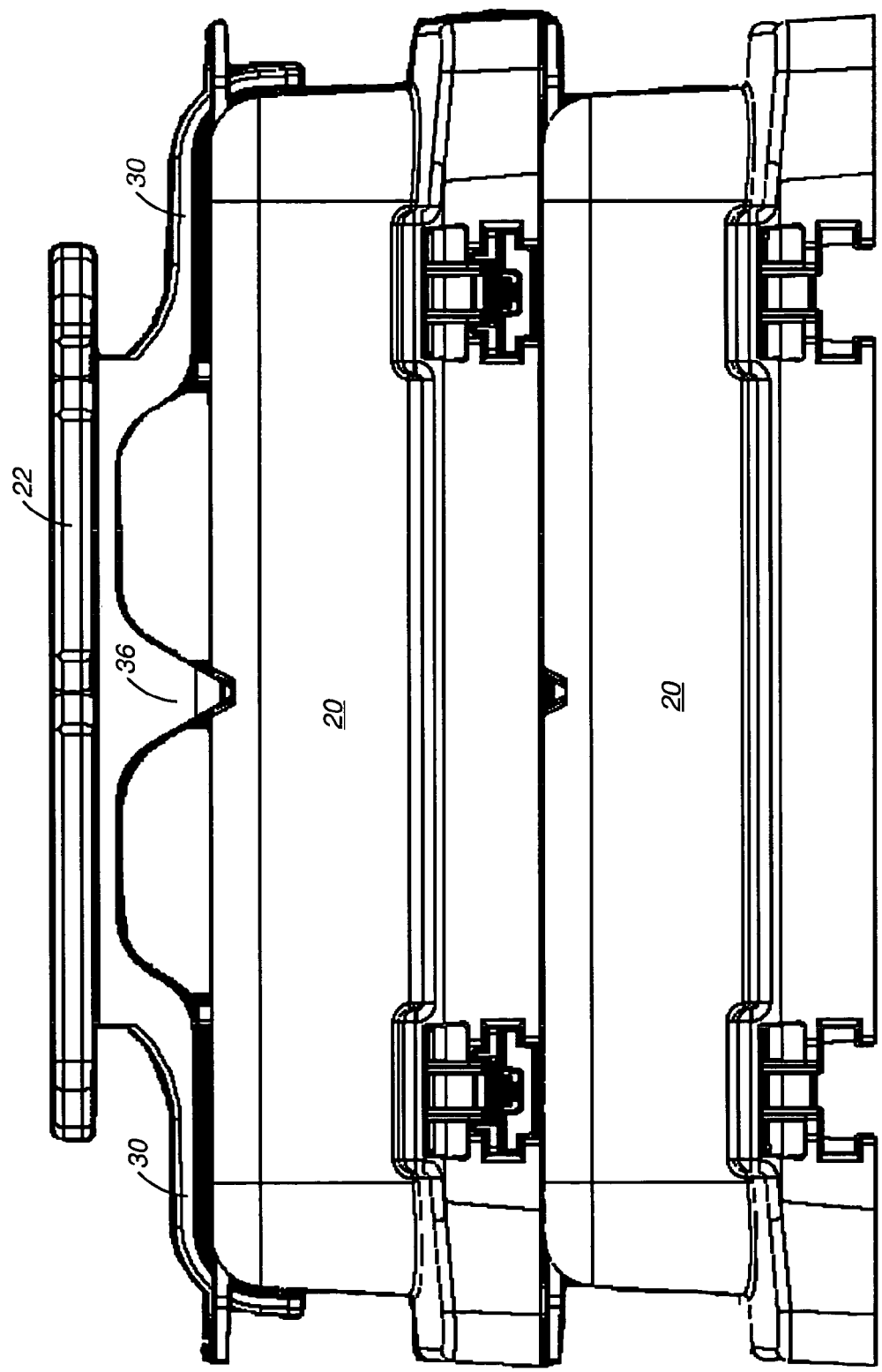
FIG. 17 is a side view of a pair of reticle carriers stacked in accordance with one embodiment of the invention.

FIG. 17 is a side view of a pair of reticle carriers stacked in accordance with one embodiment of the invention. This figure shows that the reticle carriers 20 may be stacked with or without the robot handle 22.

The reticle carrier 20 is designed so that all the parts snap fit together for easy construction. Many of the parts are designed so they fit in only the correct orientation, so that no errors occur in the orientation of the reticle. In addition to the advantages obtained by the mechanical design , the materials used for the reticle carrier are inherently antistatic. The cover 24 is made of a transparent, methylmethylacrylate polymer, in one embodiment. The transparent feature allows the reticle to be viewed through the cover 24. The door 46 is made of a carbon filled polycarbonate or polypentane in one embodiment. The carbon is added to make the plastic conductive so that it is anti-static. In one embodiment, the gasket 60 is made of TPU thermoplastic urethane that is conductive. The reticle holder 50 is made of a carbon filed polycarbonate in one embodiment. The latches 70 and lock 72 are made of carbon filed PEEK (PolyEtherEtherKetone) or PTFE (Polytetrafluoroethylene). All the parts are made of materials that have inherently low ionic and organic contaminants known to damage reticles or produce ionic or organic contaminants.

Thus there has been described an improved reticle carrier that is stackable, easy to carrier and has fewer contamination issues.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

What is claimed is:

1. A reticle carrier comprising:
   a cover having a top and an underside; the cover top including grooves and openings;
   a robot handle that snap fits onto the cover; the robot handle including alignment pins and arms, wherein the robot handle has a single alignment orientation on the cover such that the alignment pins engage the cover grooves and the arms snap fit into the cover openings;
a door mating with the cover;
a reticle holder for engaging a reticle;
a gasket.

2. The carrier of claim 1, further including a pair of reticle holders snap fitting into the cover.

3. The carrier of claim 1, wherein the robot handle has asymmetric arms.

4. The carrier of claim 1, further including:
the cover having a latch port;
a latch having a tongue, the latch mating with the latch port; and
the door having a flange that mates with the tongue of the latch.

5. The carrier of claim 4, wherein the latch is not biased in an open or a closed position.

6. The carrier of claim 5, further including a locking lip that engages a ridge of the latch.

* * * * *